United States Patent [19]
Hirabayashi

[11] Patent Number: 6,023,095
[45] Date of Patent: Feb. 8, 2000

[54] SEMICONDUCTOR DEVICE AND MANUFACTURE METHOD THEREOF

[75] Inventor: Hiroshi Hirabayashi, Tokyo, Japan

[73] Assignee: NEC Corporation, Tokyo, Japan

[21] Appl. No.: 09/050,941

[22] Filed: Mar. 31, 1998

[30] Foreign Application Priority Data

Mar. 31, 1997 [JP] Japan ................................. 9-079496

[51] Int. Cl.[7] .............................................. H01L 23/552
[52] U.S. Cl. ........................... 257/659; 257/288; 257/660
[58] Field of Search .................................... 257/659, 414, 257/288, 660

[56] References Cited

U.S. PATENT DOCUMENTS

| | | |
|---|---|---|
| 5,136,357 | 8/1992 | Hesson et al. . |
| 5,459,349 | 10/1995 | Kobatake ................................. 257/659 |
| 5,585,664 | 12/1996 | Ito ........................................ 257/659 |

FOREIGN PATENT DOCUMENTS

| | | |
|---|---|---|
| 0564897 A1 | 10/1993 | European Pat. Off. . |
| 59-43536 | 10/1984 | Japan . |
| 2-82531 | 3/1990 | Japan . |
| 2-146850 | 12/1990 | Japan . |

OTHER PUBLICATIONS

Patent Abstracts of Japan, vol. 017, No. 398 (E–1403), Jul. 26, 1993.

Patent Abstracts of Japan, vol. 095, No. 007, Aug. 31, 1995.

*Primary Examiner*—Sheila V. Clark
*Attorney, Agent, or Firm*—Foley & Lardner

[57] ABSTRACT

There is disclosed a semiconductor device which is at least partially provided with an element having one-conductive type layers 7 and 9 being conductive in reverse to an oppsite conductive type semiconductor substrate 1. At the same time when the one-conductive type layers are formed, the one-conductive type layers 7' and 9' are formed in a region in which a signal input/output pad 14 is formed. Additionally, contact holes 11' are made in peripheral positions of the one-conductive type layers 7' and 9' in an interlayer insulating film 10 which is formed on a surface of the semiconductor substrate 1. In a region surrounded by the contact holes 11, on a surface of the interlayer insulating film 10, the signal input/output pad 14 is formed. Simultaneously with formation of the signal input/output pad 14, in a peripheral position of the signal input/output pad 14 formed is a noise shielding electrode 15 which is electrically connected to the contact holes 11.

4 Claims, 9 Drawing Sheets

SEMICONDUCTOR DEVICE AND MANUFACTURE METHOD THEREOF

BACKGROUND OF THE INVENTION

1. Field of the Invention

The present invention relates to a semiconductor integrated circuit device, and more particularly to an electrode pad structure for reducing noises transmitted between an electrode pad and an element and a manufacture method thereof.

2. Description of the Prior Arts

Recently, in a large scale integrated circuit (LSI) in which analog and digital circuits co-exist, an adverse effect of a substrate noise on an analog circuit property has been increased. Since the digital circuit is operated at a high speed, the substrate noise generated during the circuit operation becomes larger relative to a signal voltage. Therefore, it is important to prevent a noise interference between the analog and digital circuits which are formed on the same semiconductor substrate. Especially, when a noise enters the substrate from a digital signal input/output electrode pad (hereinafter referred to as the signal-input/output pad) with a larger area as compared with the element, a substrate potential under the analog circuit is made unstable by the noise. This adversely affects the analog circuit property. To solve the problem, i.e., not to give to an analog circuit substrate the adverse effect of the substrate noise generated in the signal input/output pad, a structure shown in FIG. 1A is proposed.

This prior art uses a technique which is disclosed in the Japanese Patent Application Laid-open No. Sho 59-43536. On a P-type semiconductor substrate 1 formed are a $P^+$-type embedded layer 2 and an epitaxially grown P-type region 3. An element region is defined by a field oxide film 4. In the element region formed are a gate oxide film 5, a gate electrode 6, an LDD diffused layer 7, a side wall 8 and a source/drain region 9 with a high concentration of impurities. These constitute an MOS transistor 100 on which an interlayer insulating film 10 is formed. Also, source and drain electrodes 12 and 13 are formed via contact holes 11. The MOS transistor 100 (shown by a dotted circle) is enlarged and shown in FIG. 1C. Inside the interlayer insulating film 10 on the field oxide film 4, a noise shielding conductive film 17 is formed of, for example, an aluminum film or the like. In an upper region formed is a signal input/output pad 14. Also, the noise shielding conductive film 17 is electrically connected via a contact hole 11a to a GND pad 18. In the constitution, as shown in FIG. 1B, by applying a GND voltage to the conductive film 17 which is provided right under the signal input/output pad 14, noises made by digital signals transmitted to the signal input/output pad 14 are shielded by the conductive film 17. Thereby, the noises are prevented from being propagated to the semiconductor substrate 1 and the elements which are provided under the conductive film 17 as shown by a chain line A.

Alternatively, as disclosed in the Japanese Patent Application Laid-open No. Sho 59-43536 and shown in FIG. 2, a noise shielding conductive film 20 is formed right under a signal wiring 19 which is connected to a signal input/output pad (not shown). Also, right above the film 20 formed is a GND electrode 21. The noise shielding conductive film 20 and the GND electrode 21 are connected via a through hole 11b. Thereby, the signal wiring 19 is surrounded by the conductive films 20 and 21 which have GND potentials. The technique is proposed for shielding noises. The same MOS transistor 100 as shown in FIG. 1C is used. Numeral 22 denotes an insulating film. The similar technique is also described in the Japanese Patent Application Laid-open No. Hei 2-82531.

In the conventional structure, however, noise shielding conductive films need to be independently formed right under and above the signal input/output pad. Therefore, the number of manufacture processes of the semiconductor device is disadvantageously increased. Also, a distance between the signal input/output pad and the noise shielding conductive film is short. Especially, since the conductive film formed right under the signal input/output pad is formed in the interlayer insulating film, the distance is shortened. Also, parasitic capacities of the signal input/output pad and the associated signal conductor are increased. Input/output signals are disadvantageously delayed largely.

SUMMARY OF THE INVENTION

An object of the present invention is to provide a semiconductor device and a manufacture method thereof which can shield a substrate noise entering a substrate via a signal input/output pad, which do not need to have a conductive film for shielding the noise and which can inhibit input/output signals from being delayed.

To attain this and other objects, the present invention provides a semiconductor device in which one conductive type layer is formed on an oppsite conductive type semiconductor substrate right under a signal input/output pad connected to an internal circuit. A constant voltage as a reverse bias relative to the semiconductor substrate is applied to the one-conductive type layer. For example, contact holes connected to the one-conductive type layer are arranged around the signal input/output pad. The contact holes are connected to a noise shielding electrode which is formed on the same layer as the signal input/output pad. The constant voltage is applied via the noise shielding electrode. Also, on the one-conductive type layer formed is a field oxide film in a region right under the signal input/output pad. The contact holes are preferably arranged around the field oxide film.

A manufacture method of the invention includes a process of forming a one-conductive type layer on an element and simultaneously forming a one-conductive type layer on a semi-conductor substrate in a region in which a signal input/output pad is to be formed, a process of forming an interlayer insulating film on a surface of the semiconductor substrate and making contact holes in the interlayer insulating film in peripheral positions of the one-conductive type layer, a process of forming the signal input/output pad in a region which is surrounded by the contact holes on a surface of the interlayer insulating film and a process of forming a noise shielding electrode in a peripheral region of the signal input/output pad including the contact holes simultaneously with formation of the signal input/output pad. Additionally, the manufacture method preferably includes a process of forming a one-conductive type region in the region in which the signal input/output pad is formed and forming a field oxide film on the semiconductor substrate excluding a peripheral region of the one-conductive type region and a process of forming a one-conductive type layer in a peripheral region of the signal input/output pad in which the field oxide film is not formed simultaneously with formation of the one-conductive type layer on the element.

DETAILED DESCRIPTION OF THE PREFERRED EMBODIMENTS

Figure 1A:
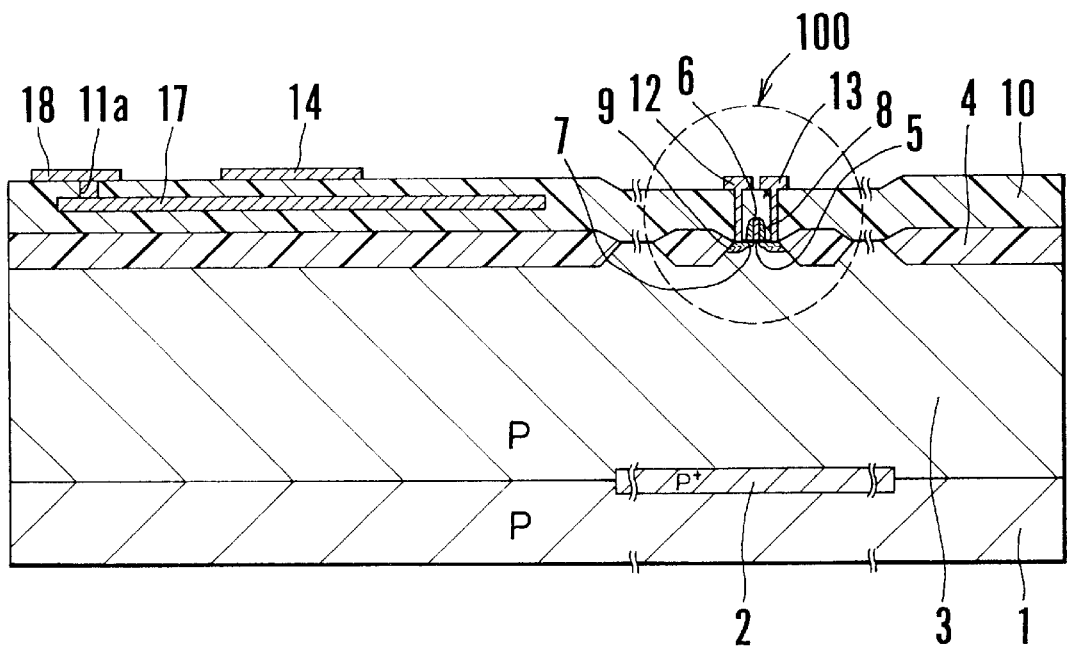
FIG. 1A is a sectional view showing an example of a conventional noise shielding structure in a semiconductor integrated circuit.
Figure 1B:
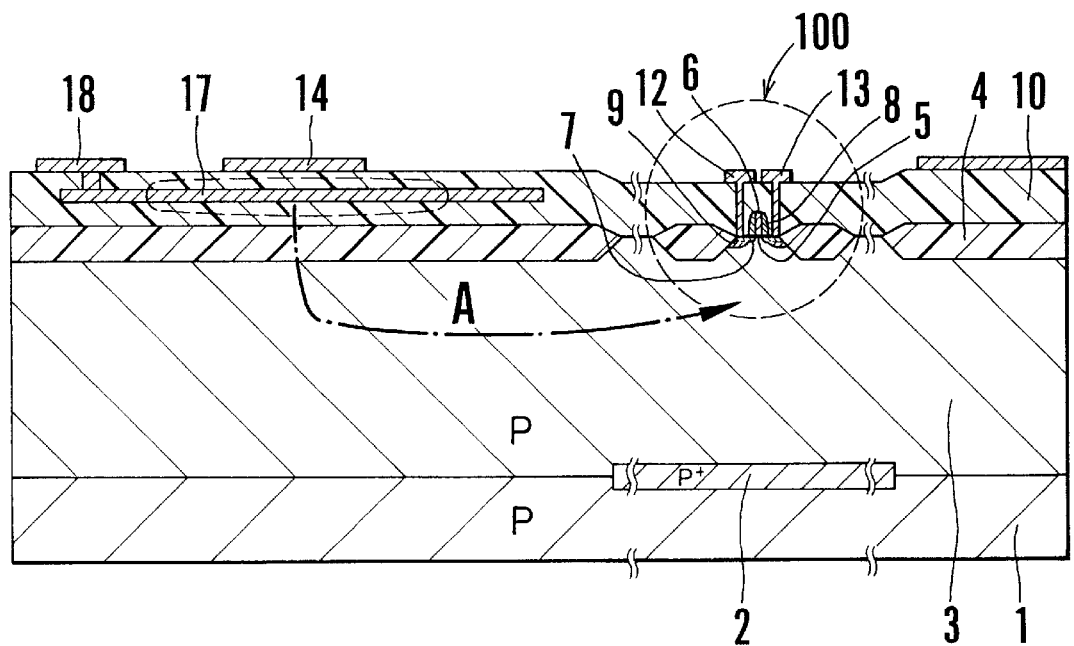
FIG. 1B is a sectional view showing noise shielding in the noise shielding structure shown in FIG. 1A.
Figure 1C:
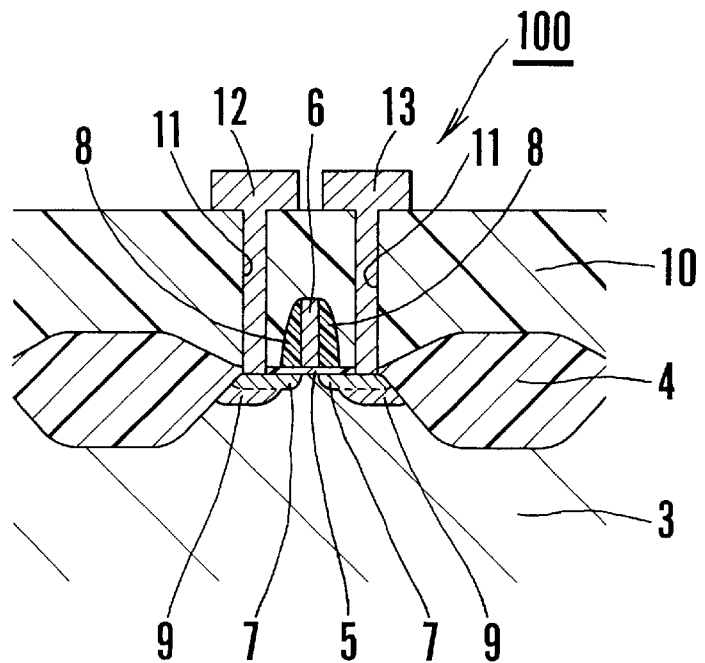
FIG. 1C is an enlarged sectional view of an MOS transistor in the integrated circuit shown in FIG. 1A.
Figure 2:
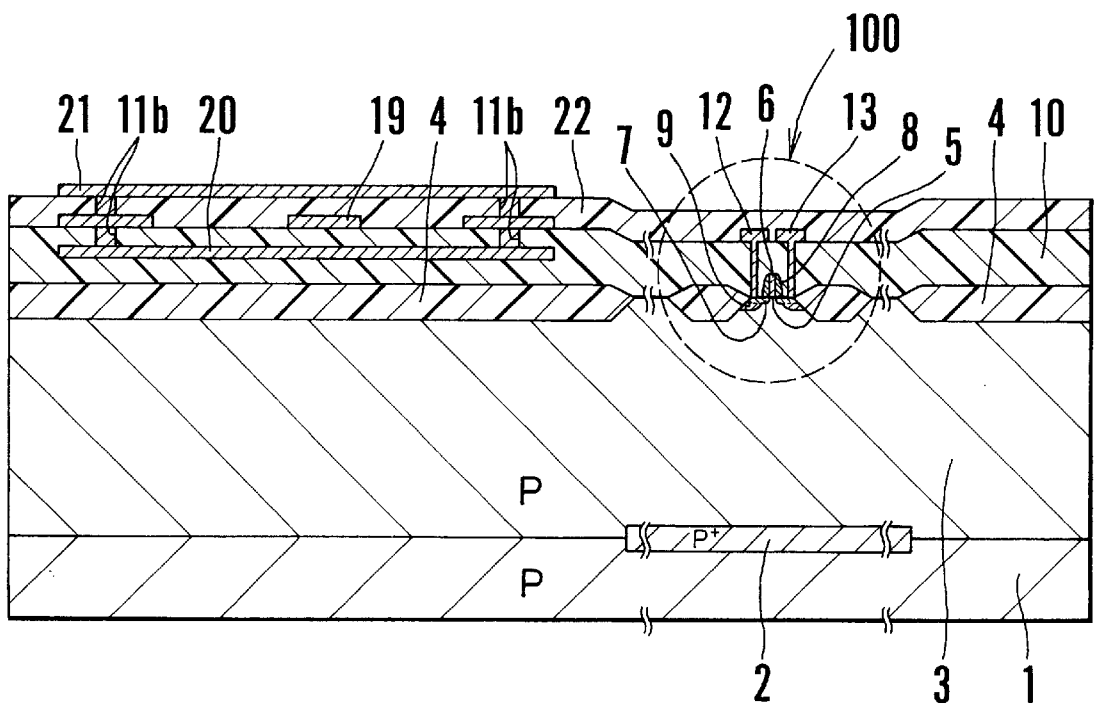
FIG. 2 is a sectional view showing another example of the conventional noise shielding structure in the semiconductor integrated circuit.
Figure 3A:
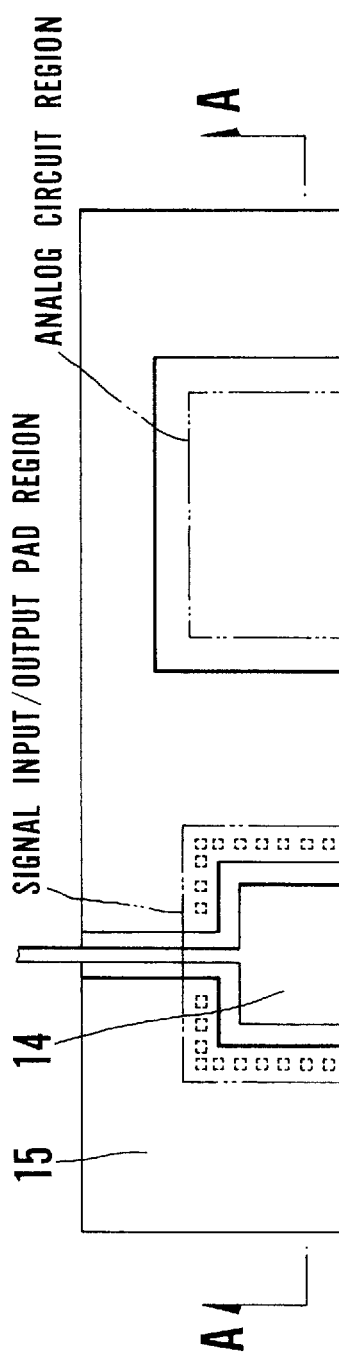
FIG. 3A is a plan view showing an embodiment of a noise shielding structure in a semiconductor integrated circuit according to the invention.
Figure 3B:
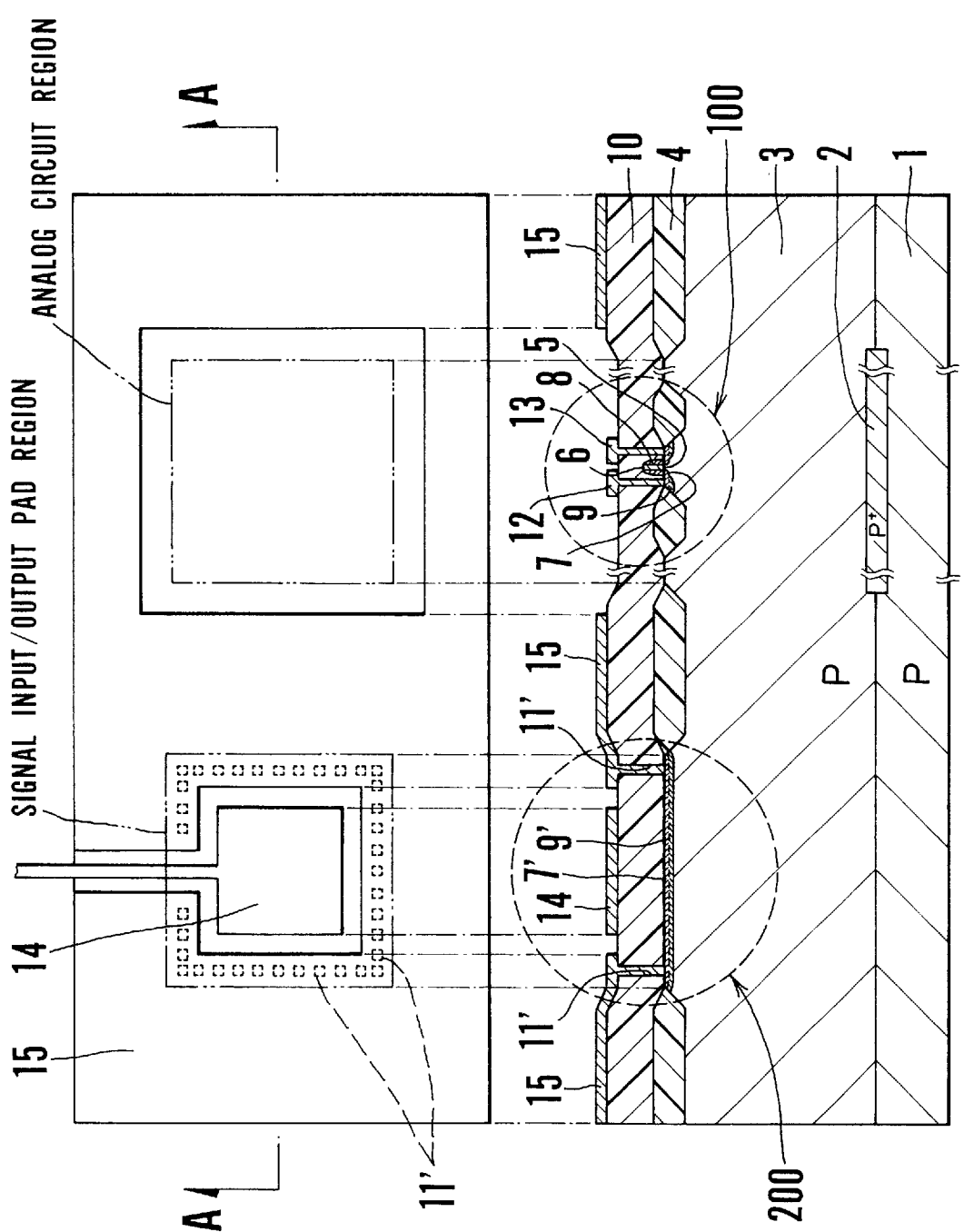
FIG. 3B is a sectional view taken along line A—A of FIG. 3A.
Figure 3C:
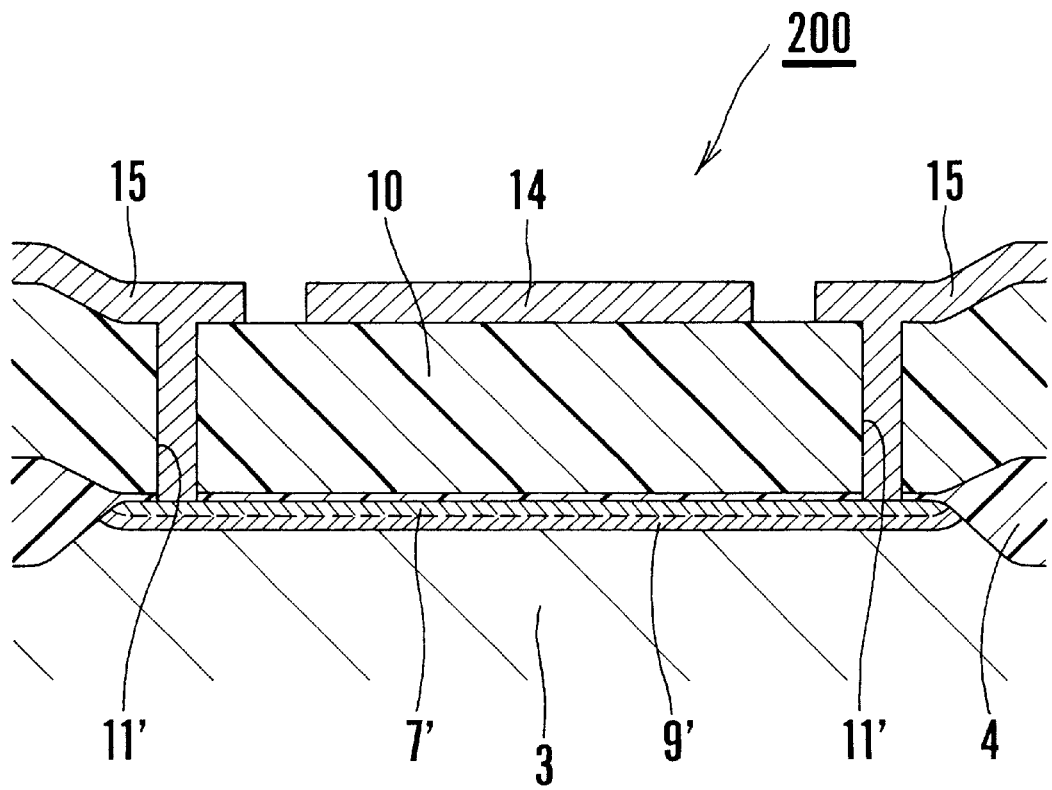
FIG. 3C is an enlarged sectional view of the noise shielding structure shown in FIG. 3B.

Embodiments of the invention will be now described with reference to the accompanying drawings. FIG. 3A is a plan view of a semiconductor device according to a first embodiment of the invention, and FIG. 3B is a sectional view taken along line A—A of FIG. 3A. In FIGS. 3A and 3B, numeral 1 denotes a P-type semiconductor substrate; 2 denotes a P$^+$-type buried layer; 3 denotes a P-type region; 4 denotes a field oxide film; 5 denotes an MOS gate oxide film; 6 denotes an MOS gate electrode constituted of a polycrystal silicon; 7 denotes an LDD diffused layer; 8 denotes an MOS gate side wall; and 9 denotes a source/drain diffused layer. These components constitute an MOS transistor 100. The MOS transistor 100 is the same as shown in FIG. 1C. Also, on the MOS transistor 100 formed is an interlayer insulating film 10. Source and drain electrodes 12 and 13 are formed via contact holes. Here, the field oxide film 4 is not formed in a region right under a signal input/output pad 14 described later. On a surface of the P-type region 3 formed are a first noise shielding conductive layer 7' and a second noise shielding conductive layer 9' laminated under the first conductive layer 7'. Here, the first conductive layer 7' is formed in the same diffusion process as a process of the LDD diffused layer 7. Also, the second conductive layer 9 is formed in the same diffusion process as that of the source/drain diffused layer 9. Then, an interlayer insulating film 10 in the region right above the conductive layers 7' and 9' formed is the signal input/output pad 14. Additionally, around the signal input/output pad 14 formed is a noise shielding electrode 15 in the same process as that of the signal input/output pad 14. The noise shielding electrode 15 is electrically connected to the first conductive layer 7' via plural contact holes 11' which are arranged around the signal input/output pad 14. Additionally, the first conductive layer 7' includes impurities which form the second conductive layer 9'. A noise shielding structure 200 (surrounded by a dotted circle) of the embodiment is enlarged and shown in FIG. 3C.

Figure 4A:
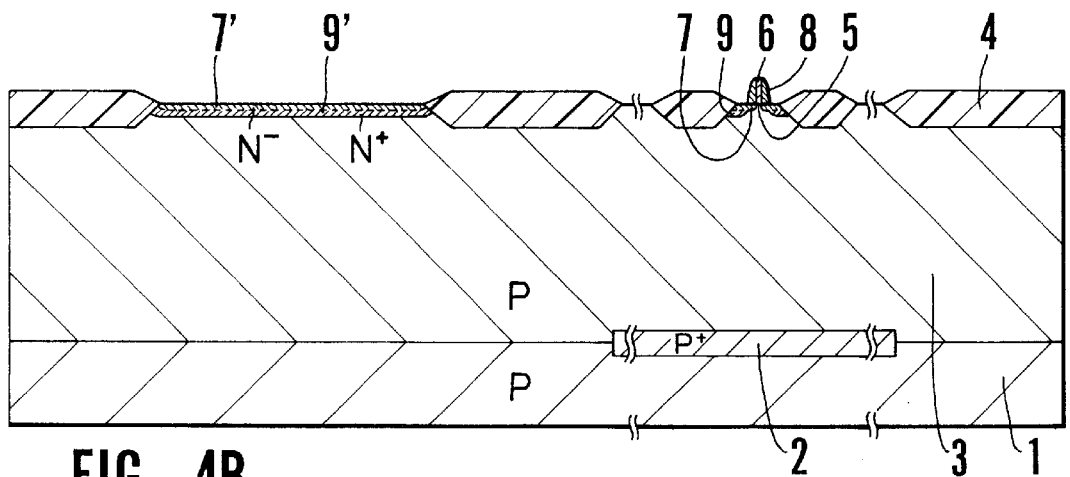
FIGS. 4A, 4B and 4C are sectional views showing manufacture processes of the semiconductor integrated circuit which has the noise shielding structure shown in FIGS. 3A and 3B.

Manufacture processes of the semiconductor device in the first embodiment will be described with reference to sectional views of FIGS. 4A, 4B and 4C. First, as shown in FIG. 4A, on the P-type semiconductor substrate 1 formed is the P$^+$-type buried layer 2 which has highly concentrated P-type impurities to prevent an N-type MOS transistor from being latched up. On the P$^+$-type buried layer 2, silicon is allowed to grow epitaxially. The P-type region 3 for determining a transistor characteristic of the N-type MOS transistor is formed by ion implantation of the P-type impurities and activation of the P-type impurities through thermal treatment. Subsequently, the field oxide film 4 (film thickness of 400 to 700 nm) is formed in a region excluding a portion for constituting an element region and a portion in which the signal input/output-pad is formed in an upper layer (hereinafter referred to as the signal input/output pad region).

Further, in the element region formed are the MOS gate oxide film 5 and the MOS gate electrode 6. Subsequently, impurities which are conductive in reverse to the substrate are ion-implanted to the signal input/output pad region and an NMOS transistor portion. Then, the LDD diffused layer 7 is formed on the MOS transistor portion, while the first noise shielding conductive layer 7' is formed on the silicon substrate in the signal input/output pad region. Further, after the MOS gate electrode side wall 8 is formed, the same conductive impurities with a high concentration are ion-Implanted under a part of the LDD diffused layer 7 of the MOS transisutor portion and the first noise shielding conductive layer 7' of the signal input/output pad region. Then, the source/drain diffused layer 9 is formed on the MOS transistor portion, while the second noise shielding conductive layer 9' is formed on the silicon substrate in the signal input/output pad region.

Figure 4B:
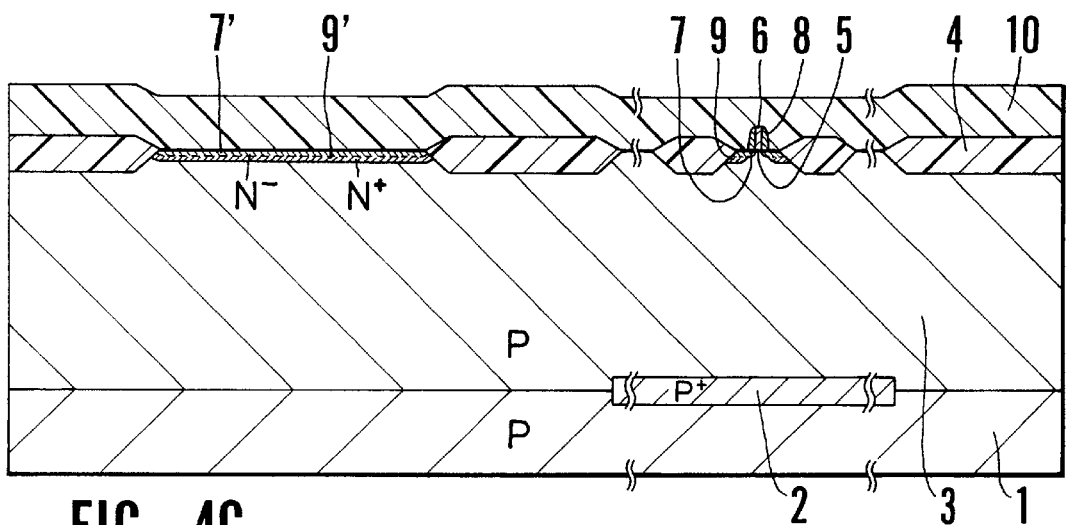
Figure 4C:
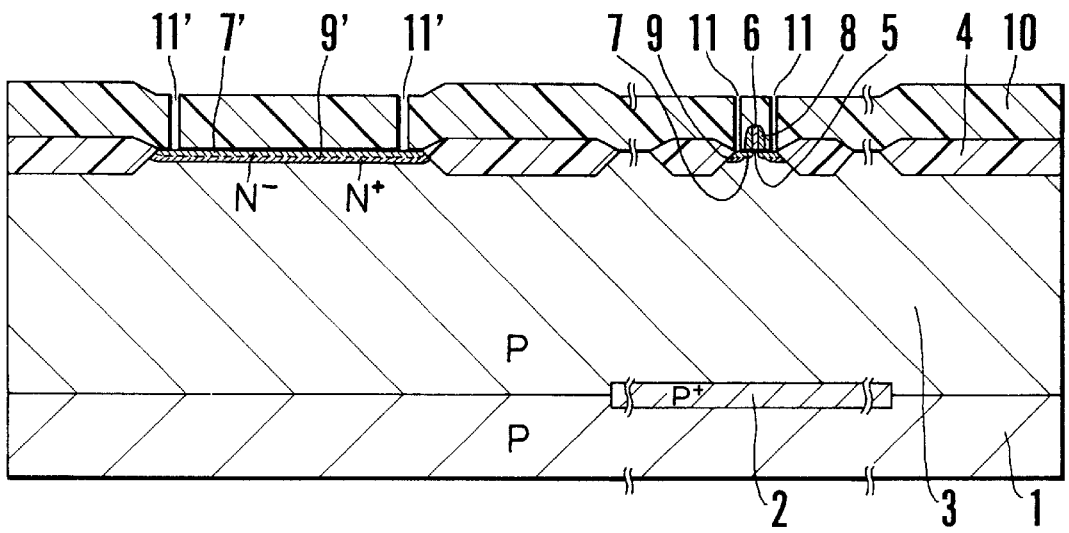

Subsequently, as shown in FIG. 4B, the interlayer insulating film 10 with a film thickness of 100 to 300 nm is formed entirely on a surface to form an interlayer insulating film. Thereafter, as shown in FIG. 4C, the drain/gate contact holes 111 and 11 are made in peripheral portions of the field oxide film above the first and second noise shielding conductive layers 7' and 9' in the signal input/output pad region as well as in the source, drain and gate regions of the MOS transistor portion. Thereafter, an aluminum or another metal material is buried in the contact holes 11 and 11'. Additionally the MOS transistor source and drain electrodes 12 and 13, the signal input/output pad 14 and the noise shielding electrode 15 are formed. consequently, a semiconductor device shown in FIGS. 3A and 3B is obtained.

In the constitution shown in FIGS. 3A and 3B, a constant voltage is applied to the N-type diffused layers or noise shielding conductive layers 7' and 9' and the noise shielding electrode 15 in such a manner that a junction capacitance between the P-type region 3 and the N-type diffused layers or noise shielding conductive layers 7', 9' becomes a reverse bias. By increasing a height of a potential barrier on a PN junction face, noises which enter the N-type diffused layers or noise shielding conductive layers 7' and 9' are prevented from entering the P-type region 3. The constant voltage is usually a GND potential.

Through reverse biasing, the junction capacitance between the U-type diffused layer and the P-type region can be increased. Consequently, as shown in FIGS. 3A and 3B, the M-type impurity diffused layers or first and second conductive layers 7' and 9' are formed as the noise shielding conductive layers on the p-type region 3. Thereby, noises can be effectively prevented from being propagated to the analog circuit which is formed in the P-type region 3. Therefore, obviated is the necessity of an independent process for forming a conductive film as a noise shielding electrode in the interlayer insulating film 10 on the semiconductor substrate. The number of manufacture processes can be reduced.

Figure 5C:
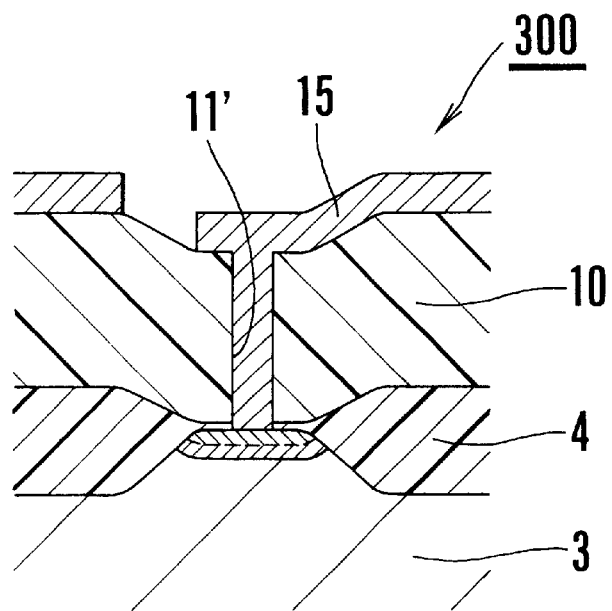
FIG. 5C is a partially enlarged sectional view of the noise shielding structure shown in FIG. 5A.
Figure 5A:
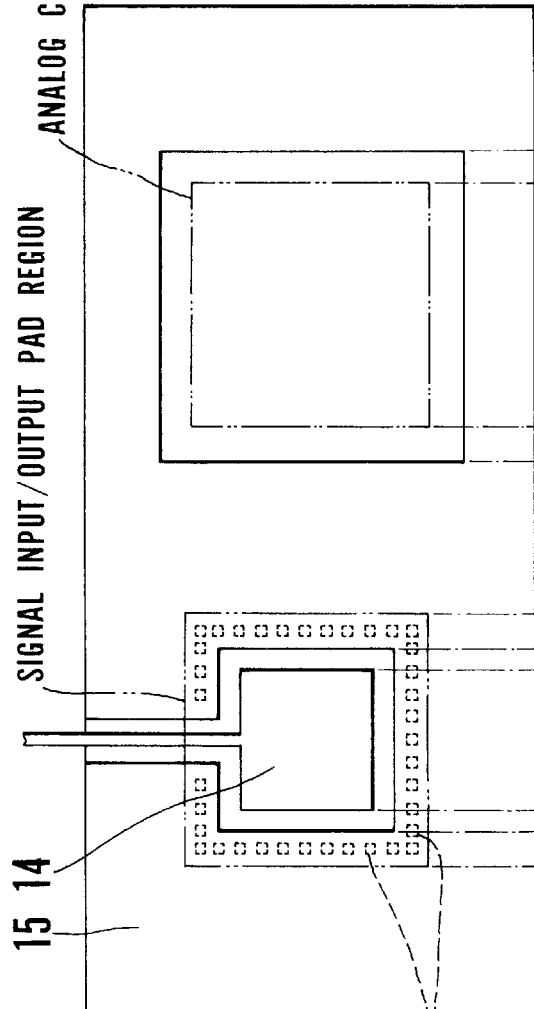
FIG. 5A is a plan view showing another embodiment of the noise shielding structure in the semiconductor integrated circuit according to the invention.
Figure 5B:
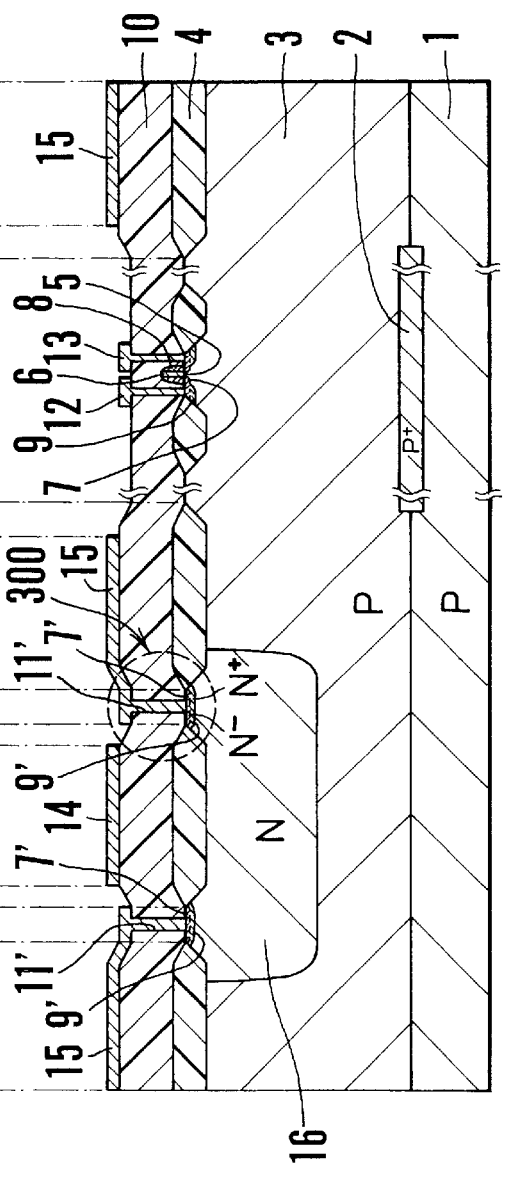
FIG. 5B is a sectional view taken along line B—B of FIG. 5A.

FIG. 5A is a plan view of a semiconductor device according to a second embodiment of the invention, and FIG. 5B is a sectional view taken along line B—B of FIG. 5A. In FIGS. 5A and 5B, the same portion as in the first embodiment is denoted by the same numerals. In the second embodiment, an N-type well 16 is formed in the P-type region of the signal input/output pad region. Further, on a surface of the N-type well 16 formed is the field oxide film 4. The N-type well 16 can be formed at the same time when an N-type well is formed, for example, in a PMOS forming region (not shown). Also, plural portions surrounding the signal input/output pad 14 of the field oxide film 4 are removed.

On a surface of the N-type well 16 in the portions, the first and second noise shielding conductive layers 7' and 9' are formed in the same manner as the first embodiment. The contact holes 11, are formed in the interlayer insulating film 10 to connect to the conductive layers 7' and 9'. Then, via the contact holes 11', the noise shielding conductive layers 7' and 9' and the N-type well 16 are electrically connected to the noise shielding electrode 15 which is formed in the same process as for the signal input/output pad 14. A noise shielding structure 300 (surrounded by a dotted circle) is enlarged and shown in FIG. 5C.

Figure 6A:
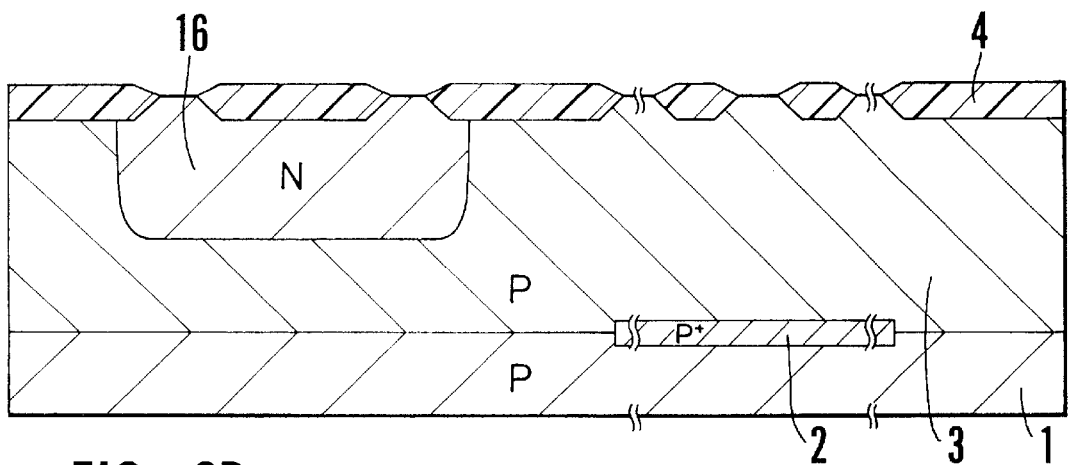
FIGS. 6A, 6B and 6C are sectional views showing manufacture processes of the semiconductor integrated circuit which has the noise shielding structure shown in FIGS. 5A and 5B.
Figure 6B:
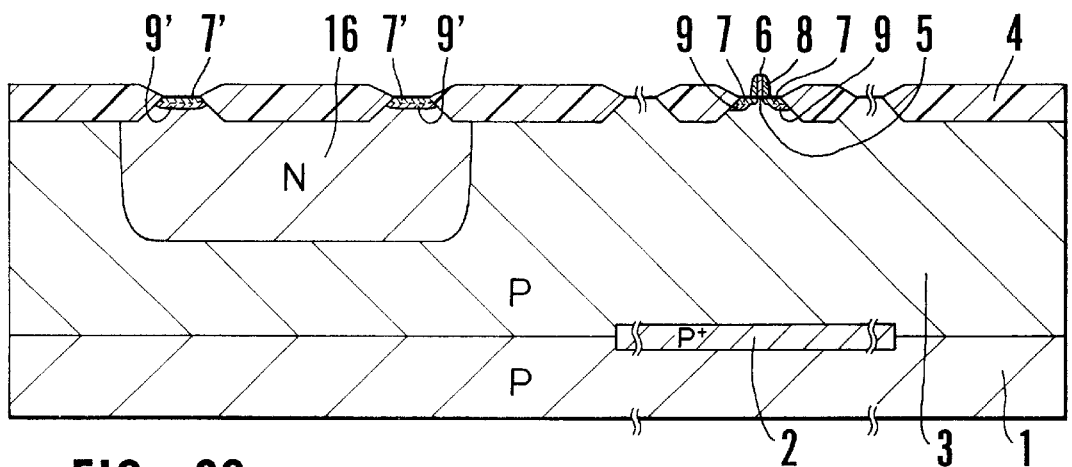
Figure 6C:
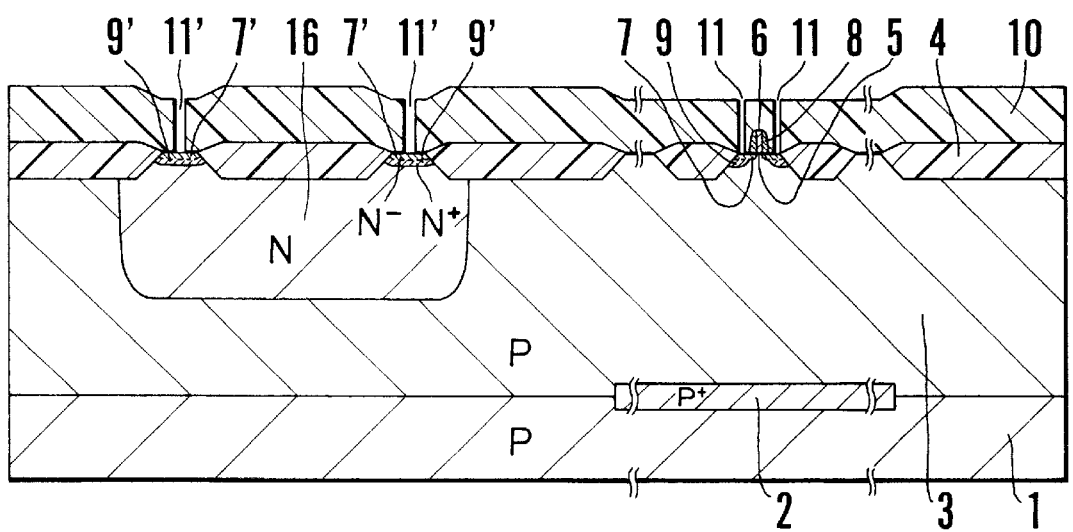

Manufacture processes of the semiconductor device in the second embodiment will be described with reference to sectional views of FIGS. 6A, 6B and 6C. First, as shown in FIG. 6A, on the P-type semiconductor substrate 1 formed is the Ps-type buried layer 2. On the layer 2 formed is the P-type region 3. Thereafter, the N-type well 16 is formed in the signal input/output pad region. Subsequently, as shown in FIG. 6B, the field oxide film 4 is formed on a surface of the P-type region 3 excluding an element region. Simultaneously, the field oxide film 4 is also formed on a surface of the N-type well 16 excluding the element region. Thereafter, in the same manufacture process as in the first embodiment, the MOS transistor is formed. At this time, simultaneously with formation of the LDD diffused layer 7 and the source/drain diffused layer 9, the first and second conductive layers 7' and 9' are formed on a surface region in which the field oxide film 4 does not exist and the N-type well 16 is exposed. Thereafter, in the same manner as the first embodiment, as shown in FIGS. 6C, 5A and 5B, the interlayer insulating film 10, the contact holes 11', the source and drain electrodes 12 and 13, the signal input/output pad 14 and the noise shielding electrode 15 are formed. Especially, the N-type well 16 is connected via the first and second conductive layers 7' and 9' and the contact holes 11, to the noise shielding electrode 15.

Figure 7:
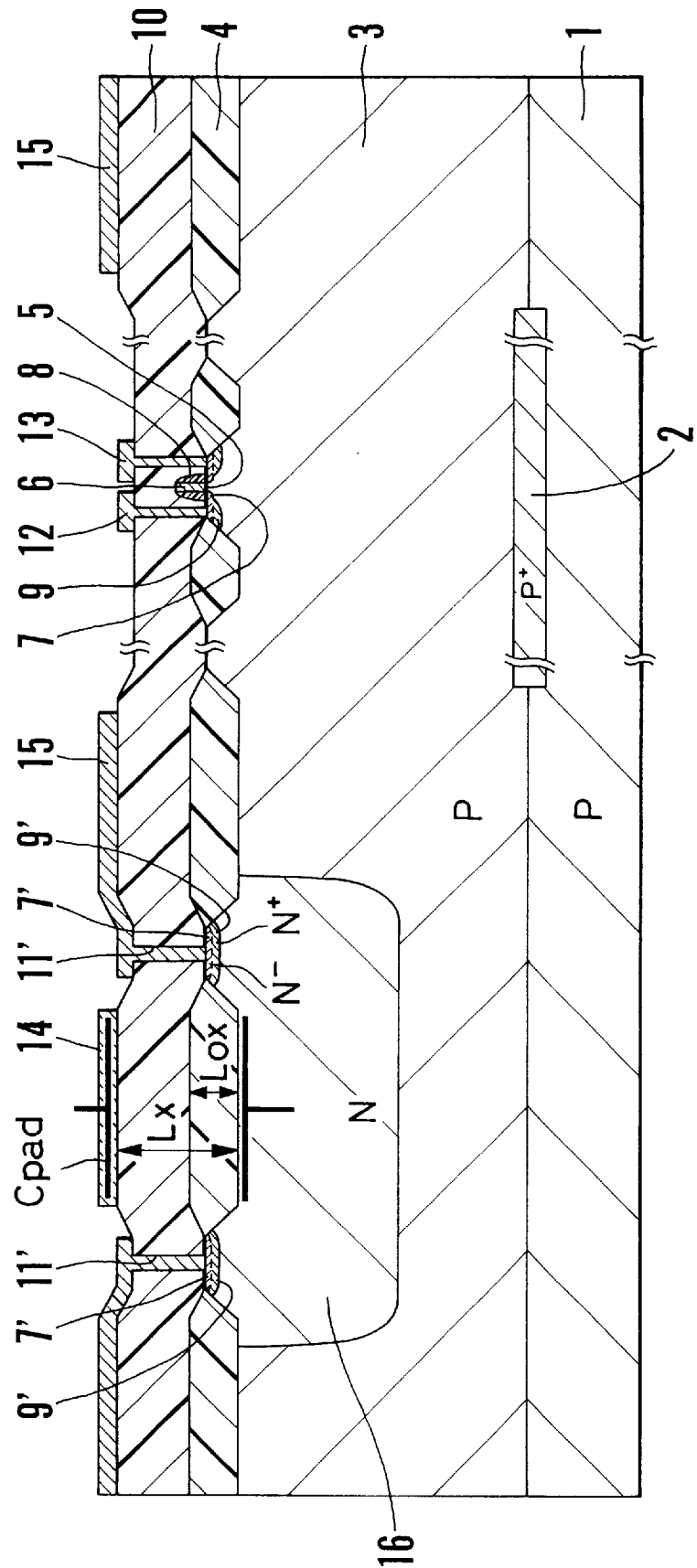
FIG. 7 is a sectional view showing noise shielding in the noise shielding structure shown in FIGS. 5A and 5B.
Figure 8:
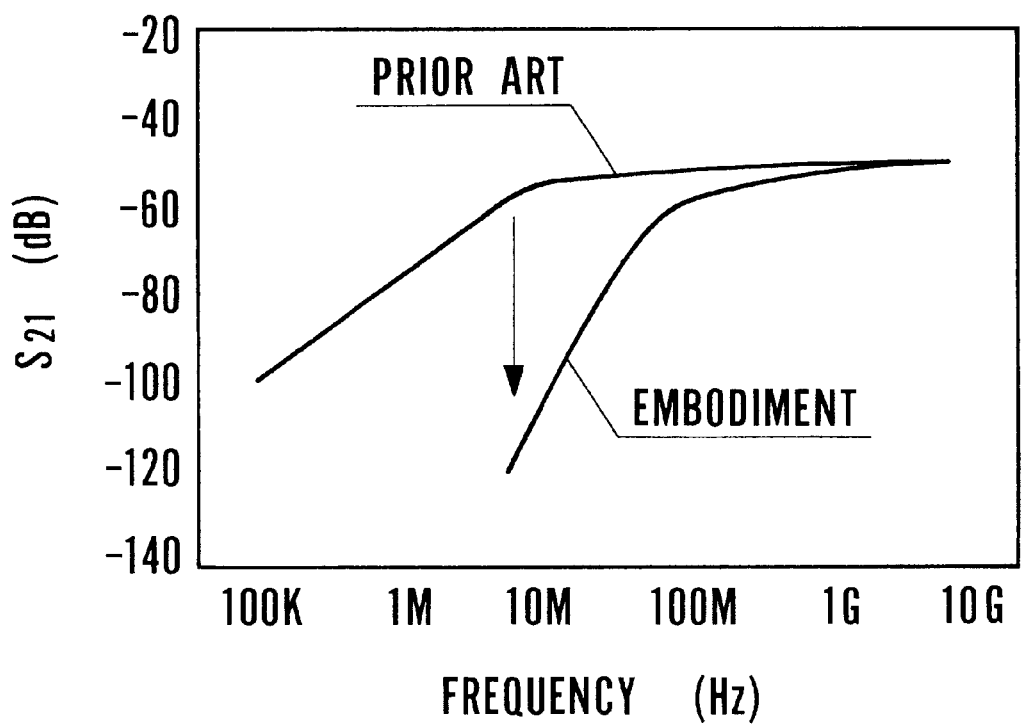
FIG. 8 is a characteristic diagram showing comparison in noise reduction effect between the semiconductor integrated circuit having the noise shielding structure of the invention shown in FIGS. 5A and 5B and the prior art.

Also in the constitution, in the same manner as the first embodiment, the constant voltage is applied to the noise shielding electrode 15 in such a manner that a junction capacitance between the P-type region 3 and the N-type well 16 becomes a reverse bias. By increasing a height of a potential barrier on a PN junction face, noises which enter the N-type well 16 are prevented from entering the P-type region 3. In the second embodiment, as shown in FIG. 7, right under the signal input/output pad 14 of the semiconductor substrate 1 formed is the field oxide film 4. Therefore, an electric distance Lx between the signal input/output pad 14 and the N-type well 16 which functions as the noise shielding conductive layer is longer by a film thickness Lox (film thickness of 400 to 700 nm) of the field oxide film 4. Then, a capacity Cpad between the signal input/output pad 14 and the N-type well 16 can be reduced. Therefore, as shown in FIG. 8, low-frequency noises can be shielded more effectively as compared with the conventional constitution. Additionally, a signal delay relative to the signal input/output pad 14 can be reduced. Specifically, a variation AQ of an electric charge in the noise shielding diffused layer relative to an amplitude AV of an input/output signal can be reduced based on AQ=C·AV.

As aforementioned, according to the invention, on the surface of the semiconductor substrate right under the signal input/output pad formed is the one-conductive type layer whose conductive type is oppsite to the conductive type of the substrate. To the one-conductive type layer applied is the potential which is a reverse bias relative to the semiconductor substrate. Therefore, the one-conductive type layer functions as the noise shielding layer. The influence of noises from the signal input/output pad to the internal circuit can be moderated. Also, the one-conductive type layer is formed in the same process as a process in which the one-conductive type layer is formed on the elements. Therefore, the number of manufacture processes is prevented from increasing. The manufacture is thus facilitated. Further, by forming the field oxide film on the surface of the semiconductor substrate right under the signal input/output pad, the insulating region distance between the signal input/output pad and the noise shielding one-conductive type layer can be lengthened. The parasitic capacitance therebetween is reduced. The effect of shielding 1 GHz or lower frequency noises can be enhanced. The semiconductor device can be operated at a high speed.

What is claimed is:

1. A semiconductor device having a substrate of a first conductivity type and which is provided with a signal input/output (I/O) pad connected to an internal circuit comprising:
    (a) an interlayer dielectric formed under said I/O pad;
    (b) a field oxide region formed under said interlayer dielectric;
    (c) a conductive shield region formed on top of said interlayer dielectric and electrically and physically separated from said I/O pad;
    (d) a semiconductor layer of a second conductivity type opposite said first conductivity type and disposed beneath said interlayer dielectric and substantially surrounding a periphery of said field oxide region formed under said I/O pad;
    (e) an electrically conductive material connecting said conductive shield region with said semiconductor layer through a plurality of vias in said interlayer dielectric; and
    (f) a well region of said second conductivity type extending beneath said field oxide region and said semiconductor layer.

2. The device as recited in claim 1 wherein said semiconductor layer comprises a first and second semiconductor layer.

3. The device as recited in claim 2 wherein said first layer is disposed on said well region and has an impurity concentration greater than said well region, and said second semiconductor layer is disposed on said first semiconductor layer and has a lower impurity concentration than said well region.

4. A semiconductor device having a substrate of a first conductivity type and which is provided with a signal input/output (I/O) pad connected to an internal circuit comprising:

(a) an interlayer dielectric formed under said I/O pad;

(b) a conductive shield region formed on top of said interlayer dielectric and electrically and physically separated from said I/O pad;

(c) a semiconductor layer of a second conductivity type opposite said first conductivity type and disposed beneath said interlayer dielectric and substantially surrounding a periphery of said interlayer dielectric formed under said I/O pad;

(d) an electrically conductive material connecting said conductive shield region with said semiconductor layer through a plurality of vias in said interlayer dielectric; and (e) said semiconductor layer comprising a first layer disposed on said substrate and having a relatively high second conductivity impurity concentration and a second layer disposed on said first layer and having a relatively low second conductivity impurity concentration.

* * * * *